United States Patent [19]

Fang et al.

[11] 4,302,764

[45] Nov. 24, 1981

[54] NONDESTRUCTIVE READ-OUT DYNAMIC MEMORY CELL

[75] Inventors: Frank F. Fang; Hwa N. Yu, both of Yorktown Heights, N.Y.

[73] Assignee: International Business Machines Corporation, Armonk, N.Y.

[21] Appl. No.: 53,471

[22] Filed: Jun. 29, 1979

Related U.S. Application Data

[63] Continuation of Ser. No. 904,115, May 8, 1978, abandoned, which is a continuation of Ser. No. 755,887, Dec. 30, 1976, abandoned.

[51] Int. Cl.$^3$ ............................................. H01L 29/78
[52] U.S. Cl. ...................................... 357/23; 357/22; 357/41; 357/42; 357/45; 357/59
[58] Field of Search .................... 357/22, 23, 41, 42, 357/45, 59

[56] References Cited

U.S. PATENT DOCUMENTS 3,952,325 4/1976 Beale et al. ........................... 357/59
4,053,915 10/1977 Cave ...................................... 357/23

OTHER PUBLICATIONS

IBM-Tech. Bul.-vol. 14, No. 11, Apr. 1972-Forbes et al., pp. 3400-3401.

Primary Examiner—Edward J. Wojciechowicz
Attorney, Agent, or Firm—Thomas J. Kilgannon, Jr.

[57] ABSTRACT

A MOSFET which is capable of being placed in two states, one of which is quasi-stable and a memory cell which includes such a device is disclosed. The device basically consists of a pair of diffusions of one conductivity type disposed in a substrate of opposite conductivity type. The channel region between the diffusions is ion implanted or diffused with a dopant which forms a channel of the same conductivity type as the diffusions. A gate electrode is spaced from the channel region by a thin oxide and the gate and substrate are biased so that two states of the device are possible. One is a stable, equilibrium or conducting state wherein an opposite conductivity type inversion layer is formed at the surface of the now buried channel. Another state is a quasi-stable, nonequilibrium, nonconductive state wherein the channel region between the diffusions is depleted of mobile charge carriers. This latter state, after a relatively long period of time in the order of several minutes to hours, decays to the stable or conducting state. By applying appropriately poled pulses to the gate or source of the device, the device may be switched from one of the two conducting states to the other. A dynamic memory cell which includes an addressing FET utilizes the device described above. A word line is connected to the gate of an addressing FET which utilizes as its drain the source of the storage device described above while a bit line is connected to the source of the addressing FET. The latter, when rendered conductive by a potential on its gate, applies appropriate write pulses from a pulsed source to place the storage device in one of its two possible states. One embodiment utilizes an annular or enclosed channel device while a memory cell embodiment utilizes an open channel device, the surface of the channel of which is isolated from the substrate by a surrounding recessed oxide (ROX). The channel surface isolation of the storage device is a requirement without which leakage from substrate to the surface would not permit the achievement of the two states of the device. The quasi-stable state remains for a time which is sufficient for most memory purposes and, to the extent that longer times are required, refreshing of the states is available.

13 Claims, 15 Drawing Figures

FIG. 2A
EQUILIBRIUM (SURFACE INVERSION)

FIG. 2C
DEEP DEPLETION

CHANNEL "ON"

FIG. 2B

CHANNEL "OFF"

W/OFF   W/ON

W/ON   W/OFF   READ

NONDESTRUCTIVE READ-OUT DYNAMIC MEMORY CELL

This is a continuation of application Ser. No. 904,115 filed May 8, 1978, now abandoned, which is a continuation of Ser. No. 755,887 filed Dec. 30, 1976 now abandoned.

BACKGROUND OF THE INVENTION

1. Field of the Invention

This invention relates generally to semiconductor storage devices for use in random access memory arrays. More specifically, it relates to a nondestructive read-out device and memory cell which are capable of being placed in two states; one stable and the other quasi-stable. Still more specifically, it relates to a device and memory cell which, by the application of appropriate biases and appropriately poled pulse potentials, can be caused to enter a deep depletion or nonconductive state or an inversion or conductive state. Still more specifically, it relates to a memory cell which includes an addressing FET disposed on the same substrate which is connected in series with the storage device. The former device is connected by its gate to a word line while the source thereof it connected to a source of pulsed potentials which set the storage device in one or the other of its two possible states. The arrangement results in a single memory storage device capable of nondestructive read-out. It is characterized by relatively long retention time and a minimum of stand-by power. The structure of the device and the memory cell may be fabricated using well-known semiconductor fabrication techniques.

2. Description of the Prior Art

U.S. Pat. No. 3,439,236 filed Dec. 9, 1965, issued Apr. 15, 1969 and entitled "Insulated Gate Field Effect Transistor with Critical Bulk Characteristics for Use as an Oscillator Component" shows in FIG. 1 thereof a structure which includes a pair of N+ diffusions in a P conductivity type substrate which are joined by an N conductivity type diffusion. The reference also includes an insulated gate disposed over the diffused channel region. The device of the reference may be operated in two different modes, which are analogous to the operation of an insulated gate field effect transistor in the enhancement mode and in the depletion mode. In the depletion mode of operation, a DC potential is applied between a source and drain providing an electric field which is above the threshold value for the particular semiconductor employed, so that current oscillations are being produced between the source and drain. A signal source connected to the gate electrode of the device now provides a negative bias to the gate electrode. The negatively charged gate electrode repels the negative charge carriers from the N conductivity type diffused region which corresponds to the channel of an insulated gate field effect transistor. The number of charge carriers (electron) in the channel region is thus depleted. When the concentration of majority carriers in the N conductivity type diffused region is reduced below a critical value, such that the product of the number of electrons/cm$^2$ times the length of the N conductivity type region in cm is less than about $10^{11}$/cm$^2$, then the oscillations will cease. In the enhancement mode of operation, a DC source provides an electric field between source and drain which is below the critical value required for the particular semiconductor employed. Accordingly, no current oscillations will be observed. The signal source connected to the source and drain then provides a positive bias to the gate electrode. The positively charged gate electrode attracts additional negative charge carriers into the N conductivity type region. When the concentration of charge carriers (electrons) in the N conductivity type diffused region is increased above a critical value, such that the product of the number of electrons/cm$^3$ times the length of N conductivity type diffused region in cm is greater than about $10^{11}$/cm$^2$, then current oscillations will occur in the device between the source and drain of the device. Thus, while the structure of the device of the reference is the same as that of the present storage device, there are no potentials applied which would cause the device to assume two states under the same bias conditions nor any indication that the surface of the channel region must be isolated from the device substrate.

An article entitled "Deep Channel MOS Transistor" by J. Berger in IEEE Transactions on Electron Devices, Vol. ED-22, No. 6, June 1975, p. 314 shows an ion-implanted MOS transistor which functions as an integrating, nondestructively readable photosensor which is fabricated using a technology which is fully compatible with advanced MOS integrated circuits. The device utilizes both P and N conductivity type buried channels in the region between source and drain. A gate electrode is disposed in insulated spaced relationship with respect to the P and N conductivity type implanted channels. With zero voltage on the gate electrode, the channel region of the same conductivity type as the source and drain and disposed below an opposite conductivity ionimplanted region is on or conductive and current can pass between source and drain. When a large negative potential is applied to the gate electrode, all the minority carriers existing in the depletion layer are attracted to the interface and the channel is turned off by depletion. The charge storage region (the implanted region of the same conductivity type as the substrate) is now capable of storing a large positive charge. Since this region is not connected with the substrate, the charge storage region remains depleted until thermal (or light) generation produces enough minority carriers. When the total positive charge in the charge storage region increases, it gradually screens off the channel region by terminating the electric field imposed by the gate electrode and hence, the channel will slowly become conductive.

The device of the article, while it turns the channel off by depletion as does the device of the present application, it appears to require the implantation of a region of the same conductivity type as the substrate at the surface of what would normally be the channel of an MOS transistor. The present device is distinguishable over the reference in that the device of the present application does not require the physical presence of a layer at the surface which is the same as the conductivity type of the device substrate. By utilizing a bias, an inversion layer is electrically generated during the stable state of the device permitting the applied electric field to be terminated on said layer and dropping most of the applied bias potential in the insulating layer. There is no hint or suggestion in either of the references cited as to how a device containing a single buried channel may be operated in a stable condition by utilizing an inversion layer.

SUMMARY OF THE INVENTION

The present invention, in its broadest aspect, relates to a semiconductor storage device which includes a semiconductor substrate of one conductivity type and a source and drain diffusion of opposite conductivity type disposed in the substrate and having a channel region therebetween. The device further includes a gate electrode disposed in insulated spaced relationship with the channel region and a region of opposite conductivity type disposed in the channel region extending from the surface of the substrate and interconnecting the source and drain diffusions. Also included are means connected to the gate electrode and the substrate for placing the device in either an equilibrium or quasiequilibrium state such that, in the former state, an inversion layer forms at the surface of the region and the device is conductive and, in the latter state, a depletion region forms between the diffusions and the device is nonconductive. Finally, means are connected to the device for switching the device between the equilibrium and quasiequilibrium state.

In accordance with the broader aspects of the present invention, the semiconductive storage device further includes means connected to the device for reading the state of the device.

In accordance with the broader aspects of the present invention, the means for switching the storage device between the states includes means connected to the gate electrode for applying a pulse of one polarity to place the device in one of its states and a pulse of the opposite polarity to place the device in the other of its states. In a similar way, means may be connected to the source diffusion for applying pulses of appropriate polarity to switch the device from one of its states to the other.

In accordance with narrower aspects of the present invention, the storage device may be embodied in the form of an annular FET so that the surface of the channel region may be isolated from the substrate.

In accordance with still more specific aspects of the present invention, means are disposed at the extremity of the channel region for isolating the surface thereof from the substrate. In one embodiment, the isolation means is a recessed oxide region disposed at the extremities of the channel region.

In accordance with the broader aspects of the present invention, an addressing FET is provided which is integral with a storage device which is capable of assuming equilibrium and quasiequilibrium states. Using potentials applied on a word line which is connected to the gate of the addressing FET and on a bit line which is connected to the source of the addressing FET, the storage device may be placed in one or the other of its states. This arrangement may be fabricated in an array using well-known integrated circuit fabrication techniques.

It is, therefore, an object of the present invention to provide a storage device which may be placed in both a stable and quasistable state.

Another object is to provide a one-device memory cell with destructive read-out.

Still another object is to provide a memory cell which requires a minimum of stand-by power.

Yet another object is to provide a memory cell which is simple in structure and easily fabricated by well-known integrated circuit fabrication techniques.

The foregoing and other objects, features and advantages of the invention will become apparent from the following more particular description of the preferred embodiments of the invention as illustrated in the accompanying drawings.

BRIEF DESCRIPTION OF THE DRAWINGS

FIG. 1B is a partial cross-sectional, partially schematic view of the device of FIG. 1A showing one of two possible states into which the device can be placed with a given bias applied to the gate electrode and substrate of the device. FIG. 1B shows an equilibrium state for the device in which the channel region is conductive. An inversion layer of the same conductivity type as the substrate is shown at the surface of the device underneath the gate electrode.

FIG. 1C is partial a cross-sectional, partially schematic view of the device of FIG. 1A showing the other of two possible states the device may assume with a given potential on the gate electrode and substrate of the device. In FIG. 1C, the channel region is nonconducting inasmuch as a deep depletion region has been formed between the source and drain. The deep depletion state is quasi-stable and eventually decays so that the device assumes the state shown in FIG. 1B.

FIG. 2D is a energy diagram representative of the condition of the channel of the device of FIG. 1C and is taken along the lines 2D—2D of FIG. 2C. FIG. 2D clearly shows the presence of a high potential barrier indicating that the channel of the device of FIG. 1C is nonconductive.

DESCRIPTION OF PREFERRED EMBODIMENTS

Figure 1A:
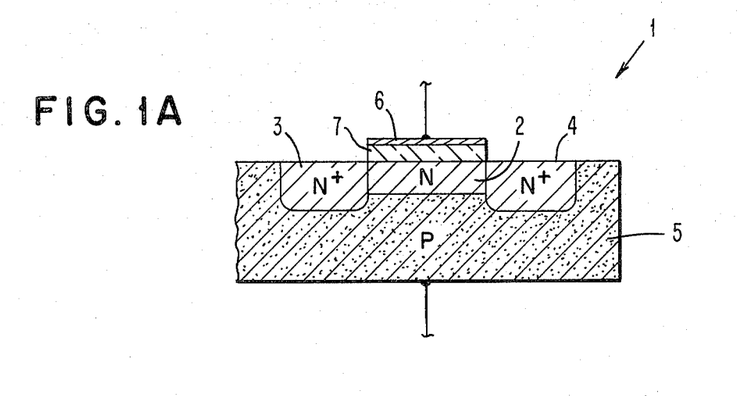
FIG. 1A is a partially schematic, partial cross-sectional view of a field effect transistor wherein the drain diffusion completely encircles the source diffusion and wherein the channel region extending between source and drain is ion implanted. The gate electrode which is disposed over the channel region atop an insulating layer is also concentric with the source and drain regions.

Referring now to FIG. 1A, there is shown therein a partially schematic, partial cross-sectional drawing of a channel MOS transistor 1 which, because of its storage capabilities, can be utilized as a nondestructive read-out dynamic memory cell. Transistor 1 may be of the type that utilizes a circular configuration for source, drain and channel regions. While not the only sort of configuration available, a transistor with such a circular or annular configuration is not subject to leakage of carriers into the surface of the channel region from the substrate as would be the case with an open-channel device. The rationale behind this statement will become clear as the description proceeds. Let it suffice to say for the present that for proper operation of the arrangements of the present application, the surface of the channel region of the device should be isolated from the substrate. In FIG. 1A, channel 2 of N conductivity type is shown disposed between N+ conductivity type source and drain regions 3, 4, respectively, all of which are disposed in a P conductivity type substrate 5. Channel 2 interconnects source 3 and drain 4 and is spaced from a gate electrode 6 by a thin dielectric or oxide layer 7. Transistor 1 may be fabricated by techniques well known to those skilled in the semiconductor fabrication art using well-known photolithographic and etching techniques as well as well-known diffusion and ion-implantation techniques. In a representative device, substrate 5 may be made of a semiconductor such as silicon doped with an acceptor impurity such as sodium or boron to provide a substrate having a resistivity of 10-20 ohm-cm. Sodium or boron concentrations of $7 \times 10^{14}$-$1.4 \times 10^{15}$ atoms/cc provide the desired resistivity. Source 3 and drain 4 are formed in the usual way by diffusing a donor impurity such as phosphorous into substrates at a concentration of $10^{20}$ atoms/cc. Channel 2 is conveniently formed by ion implantation using phosphorous as a dopant. Channel 2 has a dosage of $5 \times 10^{11}$ atoms/cm$^2$ and the implantation can be carried out at 160 keV in a well-known manner prior to the formation of gate electrode 6. The resulting implantation exhibits a maximum at an Rp ~1500 Å and a $\Delta$Rp ~600 Å. It should be appreciated that the formation of channel 2 may also be formed by diffusion or other technique well known to those skilled in the semiconductor fabrication art. Gate electrode 6 may be formed of a metal such as aluminum or may otherwise be formed of polycrystalline silicon. The resulting device 1 may be characterized as an MOS device having an enclosed channel the surface of which is isolated from the substrate.

Any memory device must be capable of achieving at least two states which can be differentiated from each other and, in addition, must be capable of maintaining either of the states under the same conditions indefinitely or for at least a time which is sufficiently long relative to its state being changed that it can be characterized as being capable of maintaining its two states indefinitely. The device of the present application fits into the latter category to the extent that one of its states is quasi-stable and ultimately decays or returns to its other possible state which is a stable state. The stable state of the device of the present application is shown in the partially schematic, partial cross-sectional view of FIG. 1B. Portions of FIG. 1B which are the same as the portions shown in FIG. 1A have been identified by the same reference characters in FIG. 1B.

Figure 1B:
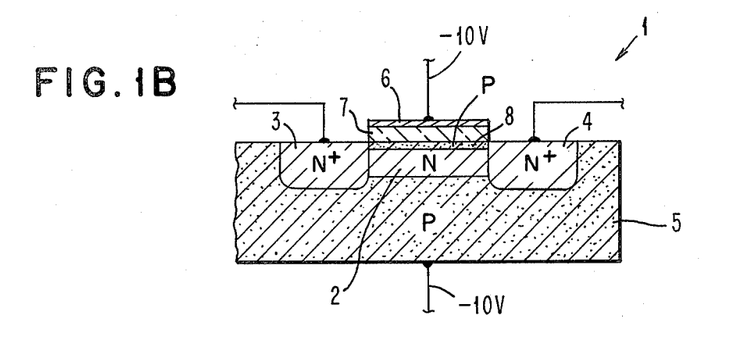

Gate electrode 6 and substrate 5 in FIG. 1B are shown having DC biases of −10 volts applied to each of these elements. Under such circumstances, and assuming the bias has been applied for a relatively long period of time, an inversion layer 8 is formed at the surface of substrate 5 adjacent dielectric layer 7 and in now buried channel 2. Inversion layer 8 is of opposite conductivity type to that of channel 2 and is the same as the conductivity type of substrate 5. The presence of inversion layer 8 indicates the equilibrium or stable state of device 1. Inversion layer 8 results from the fact that holes, from whatever source, are attracted into the depleted channel region and congregate at the surface of the device forming a P-type surface inversion layer. The remainder of implanted region 2 remains N-type and interconnects the N+ conductivity type source 3 and drain 4. Device 1 of FIG. 1B is now in the conducting or "ON" condition and current can flow between diffusions 3 and 4. Under the bias conditions shown, the total voltage applied to gate electrode 6 is dropped across dielectric 7 inasmuch as the applied electric field is terminated on the positive charges present in inversion layer 8.

Assuming that the ON or conducting state is a binary "1", applying a more negative bias to the gate will not eliminate the P conductivity type surface inversion layer 8 and the device remains conductive.

Figure 1C:
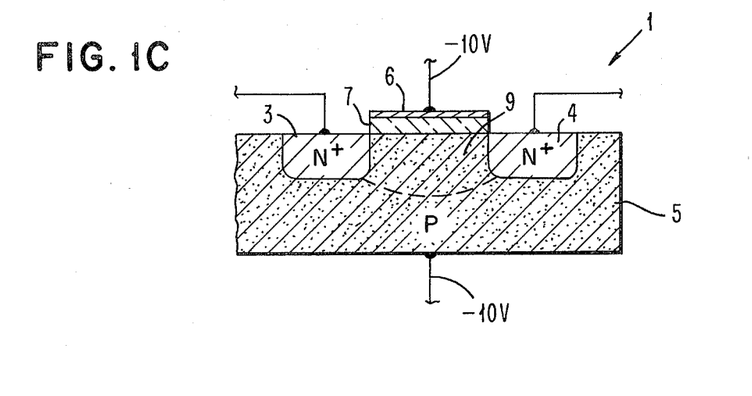

Another possible state is the "OFF" or nonconducting or quasiequilibrium state which is shown in FIG. 1C. FIG. 1C is similar to FIG. 1B except that layer 2 and inversion layer 8 are not shown and a depletion region 9 is shown between diffusion 3, 4. Depletion region 9 contains no mobile charge carriers, the latter having been swept out as a result of the formation of depletion region 9. Because of the absence of mobile charge carriers, no current can flow between diffusions 3, 4 and device 1 of FIG. 1C is nonconductive.

To form a depletion region 9, a positive voltage pulse is superimposed on the negative bias applied to gate electrode 6. The positive voltage drives out positive mobile charge carriers which are present in inversion layer 8. This action leaves the negative mobile charge carriers which have a low concentration relative to the positive charge carriers. When the pulsed positive voltage is reduced to the original negative bias level, the remaining negative mobile charge carriers are driven out thereby depleting the affected region of all mobile charge carriers. Under these circumstances, the electric field applied via electrode 6 terminates on positive charges near the extremity of depletion region 9 and practically the total voltage drop appears across depletion region 9 in silicon substrate 5. Device 1 is now nonconducting or in a quasi-stable and no current flows inasmuch as no mobile charge carriers are present in the depletion region. This nonconducting state is characterized as quasi-stable because after a period of time which may amount to several minutes at room temperature, holes or positive charge enter the depletion region and device 1 returns to the stable state represented in FIG. 1B with inversion layer 8 in implanted channel region 2 at the surface of substrate 5.

To change the state of the device of FIG. 1C from nonconducting to conducting, a negative pulse may be superimposed on the bias. By the injection of holes or other mechanisms, such as recombination, holes enter depletion region 9 and are accelerated to the surface of substrate 5 where they accumulate and reform inversion layer 8. The applied bias field now terminates on inversion layer 8; device 1 is in the state shown in FIG. 1B, and current can flow via negative mobile charge carriers between source 3 and drain 4.

Figure 2A:
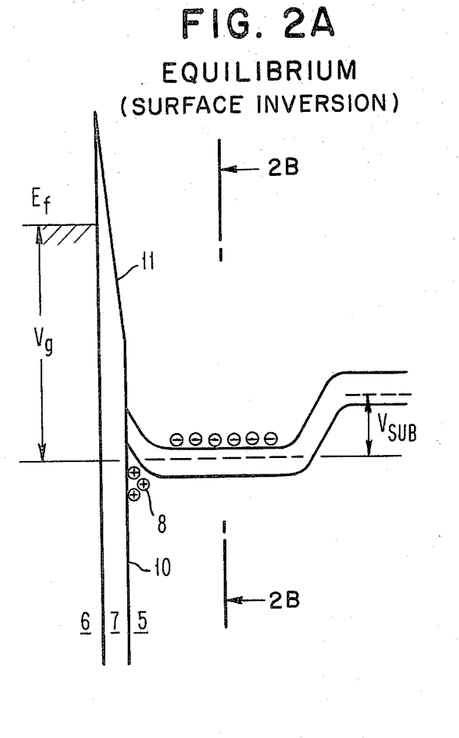
FIG. 2A shows a band diagram which is representative of the state of the device shown in FIG. 1B. The band diagram is representative of an equilibrium state and shows the surface inversion of the semiconductor near the semiconductor oxide interface. The direction of the channel is into the page.

Referring now to FIG. 2A, there is shown a band diagram of the equilibrium or surface inversion condition of FIG. 1B. In FIG. 2A, the potential is shown vertically while distance into a silicon substrate is shown in a horizontal direction. A conductive region is depicted spaced from the silicon region by an oxide or dielectric region. To the extent that the diagram of FIG. 2A represents elements shown in FIG. 1B, the equivalent regions in FIG. 2A have been labeled with the same reference characters. Thus, the left-most region of FIG. 2A represents gate electrode 6 while the right-most region of FIG. 2A represents P conductivity type substrate 5. These two regions are spaced from one another by dielectric or oxide layer 7. Inversion layer 8 is shown at the interface 10 between dielectric layer 7 and substrate 5. Sloping portion 11 in FIG. 2A indicates that in the equilibrium or surface inversion mode of operation most of the applied potential is dropped across dielectric or oxide layer 7.

Figure 2B:
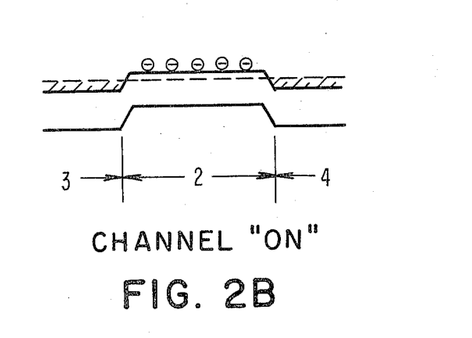
FIG. 2B shows the energy diagram of the channel of the device of FIG. 1B which is taken along line 2B—2B of FIG. 2A. This diagram clearly indicates that the channel of the device of FIG. 1B is conductive.

FIG. 2B which shows the energy diagram of the device of FIG. 1B is taken along line 2B—2B of FIG. 2A shows the energy distribution at source 3, drain 4 and buried channel 2. From FIG. 2B, it should be clear that because of the relatively low potential barrier in channel region 2, current can flow between source 3 and drain 4 with the application of a very small potential difference.

Figure 2C:
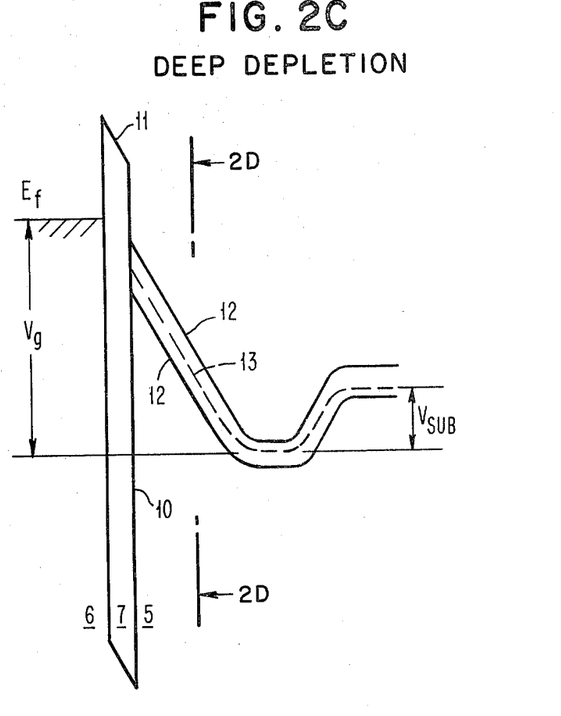
FIG. 2C is a band diagram which is representative of the state of the device shown in FIG. 1C when the channel thereof has been deeply depleted. Under such circumstances, the channel of the device of FIG. 1C is nonconductive and a greater part of the applied voltage is dropped in the semiconductor than in the gate dielectric.

FIG. 2C shows a band diagram for the deep depletion state exhibited by the device shown in FIG. 1C. Under the influence of the applied bias voltage $V_g$ and after a positive pulse has been applied to gate electrode 6, the device of FIG. 1C exhibits the band diagram shown in FIG. 2C. It should be noted in FIG. 2C that sloping portion 11 does not taper as sharply as it did in FIG. 2A indicating that, in the deep depletion mode, only a small portion of the applied bias is dropped across dielectric or oxide layer 7. The application of positive potential on gate electrode 6 swept out the positive charges 8 of FIG. 2A and, in addition, negative mobile charge carriers are removed upon the return of the pulsed positive voltage to the negative bias level. The sloped band edges 12 and quasi-Fermi level 13 in FIG. 2D indicate that the greater part of the applied gate voltage is being dropped in the depletion region in silicon substrate 5.

Figure 2D:
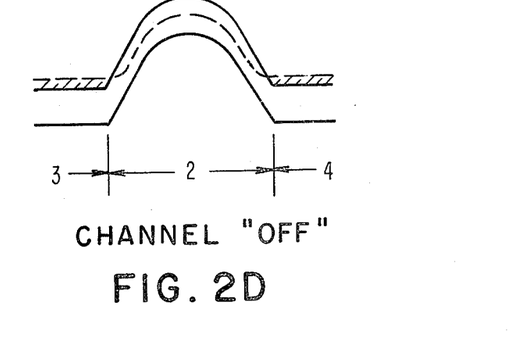

FIG. 2D shows an energy diagram similar to that shown in FIG. 2B representative of the condition of the channel of the device of FIG. 1C and is taken along lines 2D—2D of FIG. 2C. FIG. 2D clearly shows the presence of a high-potential barrier in the channel region 2 indicating that channel 2 of the device of FIG. 1C is nonconductive. A comparison between FIGS. 2B and 2D clearly shows that two conditions, one conducting and the other nonconducting, can be achieved with the device of the present application. The condition shown in FIG. 2B is stable and the device will remain in a conducting state as long as the required biases are maintained on the device. The state shown in FIG. 2D, however, is quasi-stable and, after a long period of time (several minutes), the energy diagram of FIG. 2D will decay to the energy diagram of FIG. 2B by virtue of leakage, recombination or other phenomena.

Figure 3A:
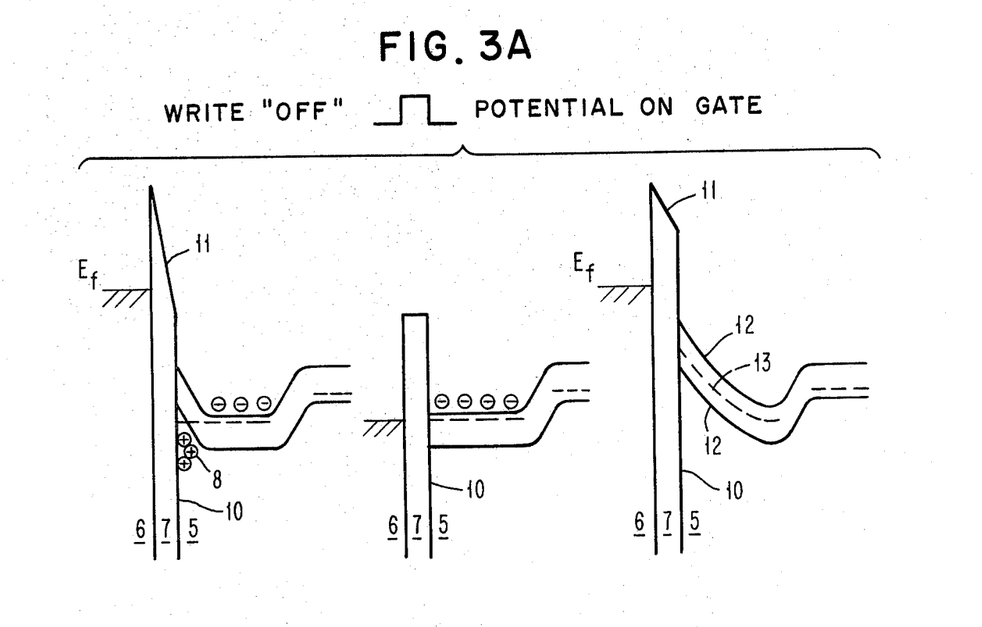
FIG. 3A shows the band diagrams obtained when the device of FIG. 1B is switched from its conductive state to the nonconductive state of FIG. 1C. This is achieved by applying a positive pulse potential to the gate of the device of FIG. 1B.

Referring now to FIG. 3A there is shown therein band diagrams obtained when the device of FIG. 1B is switched from its conductive state to the nonconductive state of FIG. 1C. As indicated hereinabove, switching is achieved by applying a positive pulse potential to gate 6 of device 1 of FIG. 1B. It should be noted that the left-most and right-most band diagrams are analogous to those shown in FIGS. 2A, 2C, respectively. The center band diagram in FIG. 3A shows the band diagram of the device in an intermediate state when a positive potential is applied to gate electrode 6. The positive voltage on the gate produces a downward bending of the bands, pushing out the accumulated holes 8 and accumulating free electrons in implanted channel 2. While not specifically shown in FIG. 3A, it should be appreciated that the transition of the positive potential back to the original bias level causes the free electrons in channel 2 to be swept out bending the bands upwardly as shown in the right-most diagram of FIG. 3A under the influence of the negative potential bias. The device has now been switched from the conducting to the nonconducting state.

Figure 3B:
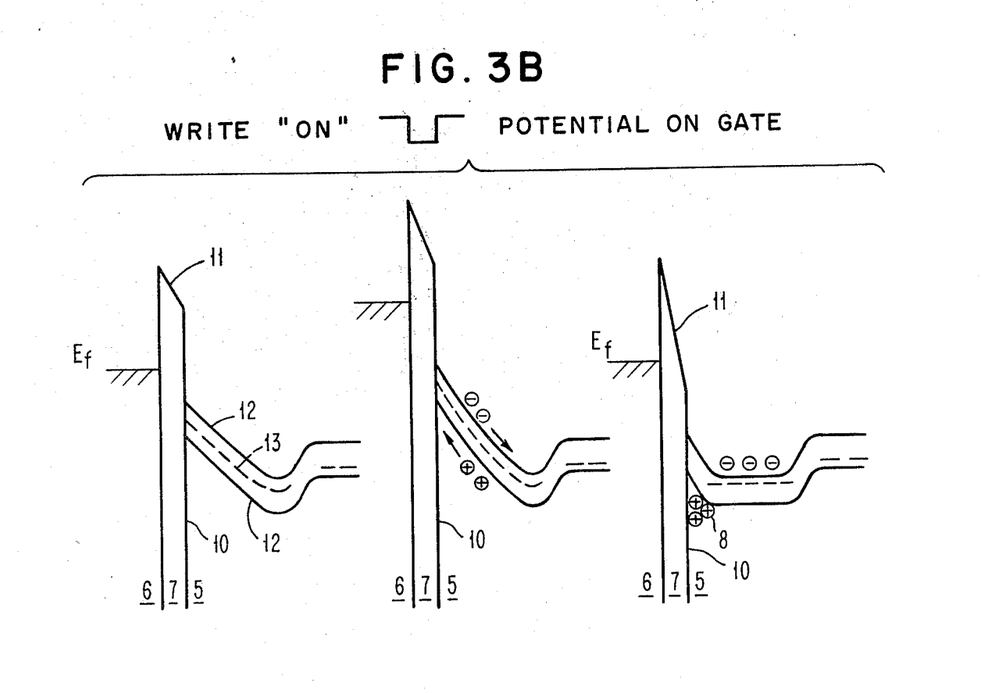
FIG. 3B shows the band diagrams obtained when a negative potential is applied to the gate of the device of FIG. 1C converting it from its nonconducting state to the conducting state shown in FIG. 1B.

FIG. 3B shows the band diagrams obtained in switching from the nonconducting to the conducting state under the influence of a negative pulse potential on gate electrode 6. In FIG. 3B, the left-most and right-most band diagrams are analogous to the band diagrams of FIGS. 2C, 2A, respectively. With a device of the present application in the quasiequilibrium state as shown in the left-most band diagram of FIG. 3B, channel 2 is totally depleted of all charge carriers and the potential applied is dropped mostly in the silicon. The electric field applied is terminated on positive charges near the boundary of the induced depletion region. Upon the application of a negative potential, the bands are bent upwardly indicating that a higher potential is being dropped in the silicon. The resulting higher field accelerates holes from whatever source toward interface 11 between oxide layer 7 and silicon substrate 5. At the same time, negative mobile charge carriers which are present as a result of recombination and leakage are driven away from the same interface 10. Upon the transition from the higher pulsed negative potential to the normal negative potential bias, the bands move downwardly indicating that a smaller amount of the applied potential is being dissipated in the silicon while a greater amount is being dropped across oxide 7. The applied field terminates on positive carriers which have accumulated at the oxide-semiconductor interface and remain there as inversion layer 8 in a stable equilibrium condition. The device of the present application has thus been switched from a nonconducting to a conducting state by the application of a negative pulse potential on gate electrode 6.

Figures 4A, 4B:
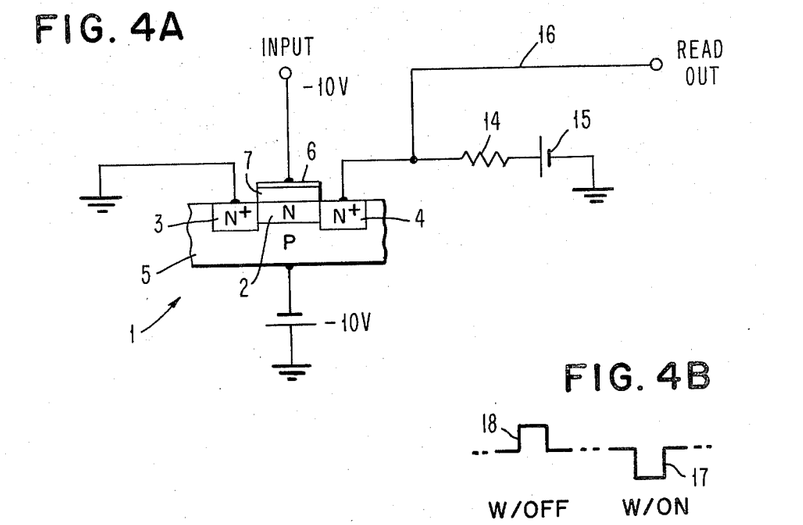
FIG. 4A is a schematic diagram of the device of FIG. 1A showing a circuit arrangement which permits the reading and writing of that device when positive and negative signals which turn the device off and on, respectively, are applied to the gate electrode.
FIG. 4B shows the write-cycle waveforms which, when applied to the gate of the device of FIG. 4A, turn the channel off and on, respectively.

Referring now to FIG. 4A, there is shown therein a circuit arrangement including the device of FIG. 1A which permits the reading and writing of that device when positive and negative signals which turn the device off and on, respectively, are applied to the gate electrode. Thus, in FIG. 4A device 1 shows a −10 volt bias applied to gate electrode 6 and a −10 volt bias applied to substrate 5. Source 3 is shown grounded while drain 4 is connected to ground via a resistor 14 and a battery 15 which is utilized as a source of current flow between source 3 and drain 4 when device 1 is conductive. A read line 16 which senses the voltage drop across resistor 14 when device 1 is conductive is connected in parallel with resistor 14. To change the state of device 1, positive and negative write cycle waveforms similar to those shown in FIG. 4B may be applied to gate electrode 6 of device 1. As discussed hereinabove in connection with all the foregoing figures, if device 1 is nonconductive it can be rendered conductive by applying the negative going waveform 17 of FIG. 4B to gate electrode 6 and, if device 1 is conductive, it can be rendered nonconductive by applying the positive going waveform 18 of FIG. 4B to gate electrode 6. At this point, it should be obvious that if device 1 of FIG. 4A is conducting, current will flow through it via source 3, buried channel 2 and drain 4. A potential drop in resistor 14 can then be sensed via read line 16. With device 1 nonconductive, of course no current will flow in device 1.

Figures 5A, 5B:
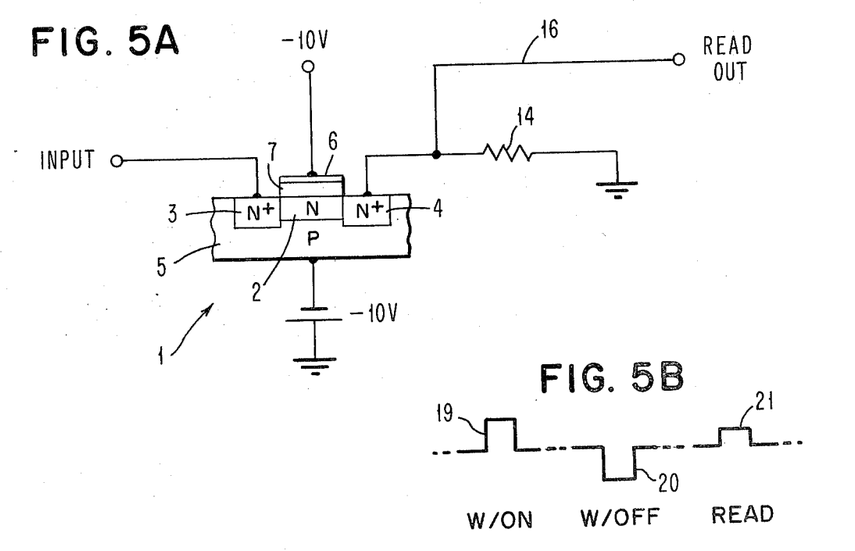
FIG. 5A is a schematic diagram of a circuit similar to that shown in FIG. 4A except that write and read pulses are applied to the source of the device rather than the gate electrode of the device.
FIG. 5B shows the write and read waveforms which are applied to the source of the device of FIG. 5A.

Referring now to FIG. 5A, a schematic diagram of a circuit similar to that shown in FIG. 4A is shown except that the write and read pulses utilized are applied to source 3 of device 1 rather than to gate electrode 6 of device 1. As is well known in the field effect transistor art, if pulses of opposite polarity to those applied to the gate of a field effect transistor are applied to the source of the same transistor, similar device operation can be expected. Thus, using the arrangement of FIG 5A, a positive pulse 19 as shown in FIG. 5B applied to source 3 of device 1 will render it conductive while a negative pulse 20 shown in FIG. 5B will render device 1 nonconductive. When device 1 is conductive, a positive read pulse 21 as shown in FIG. 5B applied to source 3 will produce a momentary voltage drop in resistor 14 which can be sensed via read line 16. At this point, it should be appreciated that the nonconductive conditions of the circuits of FIG. 4A, 5A are quasi-equilibrium states and, that after a reasonably long period of time in the range of several minutes, this quasi-equilibrium will decay to the equilibrium, conductive state discussed hereinabove. Under the usual operating circumstances, however, it is expected that devices in the nonconducting or quasi-equilibrium state will be rewritten with either new information or can be refreshed to preserve the information in a device for as long as required. In the usual case, refreshing can be carried out by reading out a device; sensing the condition of the device, and rewriting the device to the same condition.

Figure 6:
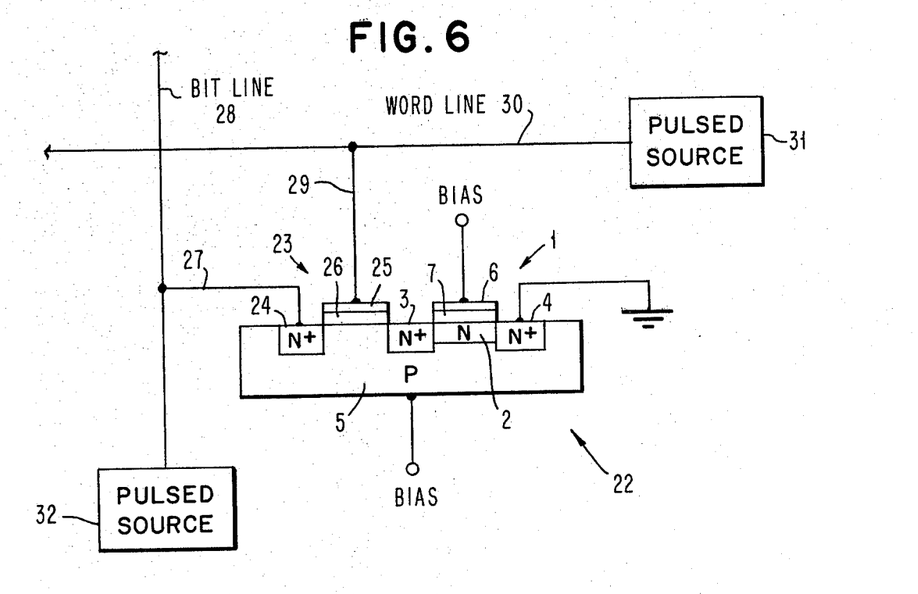
FIG. 6 is a schematic diagram which shows the utilization of the device of FIG. 1A in a memory cell environment. In addition to the device of FIG. 1A, the circuit includes an addressing FET; the gate and source of which are connected to the word and bit lines of a memory array.

Referring now to FIG. 6, there is shown therein a schematic diagram of a circuit which shows the utilization of the device of FIG. 1A in a memory cell environment. In addition to the device of FIG. 1A, the circuit includes an addressing FET, the gate and source of which are connected to the word and bit lines, respectively, of an associated memory array. Memory cell 22 of FIG. 6 includes an MOS transistor 1 similar to that described in connection with FIG. 1A above. MOS transistor 1 includes a channel 2, source 3, drain 4, gate electrode 6 and dielectric layer 7. Source 3 of transistor 1 is shown in FIG. 6 as being common with an addressing transistor 23. Addressing transistor 23 includes a source diffusion 24 and a gate electrode 25 which is interposed between diffusions 3, 24 and spaced from an underlying channel region by a dielectric or oxide layer 26. Diffusion 24 is connected via interconnection 27 to a memory array bit line 28 while gate electrode 25 of device 23 is connected via an interconnection 29 to a memory array word line 30. Addressing FET 23 is operated so that it is ordinarily nonconducting until an appropriate potential from pulsed source 31 is applied to gate electrode 25 via word line 30. Once addressing FET 23 has been rendered conductive, potentials from pulsed source 32 may be applied via bit line 28 and interconnection 27 to diffusion 24. Because addressing device 23 is now conductive, current flows to common diffusion 3 and, using the potentials and writing scheme shown in FIGS. 5B and 5A, transistor 1 may be placed into either of its two possible states and that state may be read out. Utilizing the arrangement of FIG. 6 or FIGS. 4A and 5A for that matter, it should be appreciated that read-out is nondestructive in character. It should also be appreciated that while only a single cell 22 has been shown in FIG. 6, a plurality of similar cells may be connected in array form to other bit lines 28 and word lines 30 and addressed and written and read in the manner described.

Figure 7:
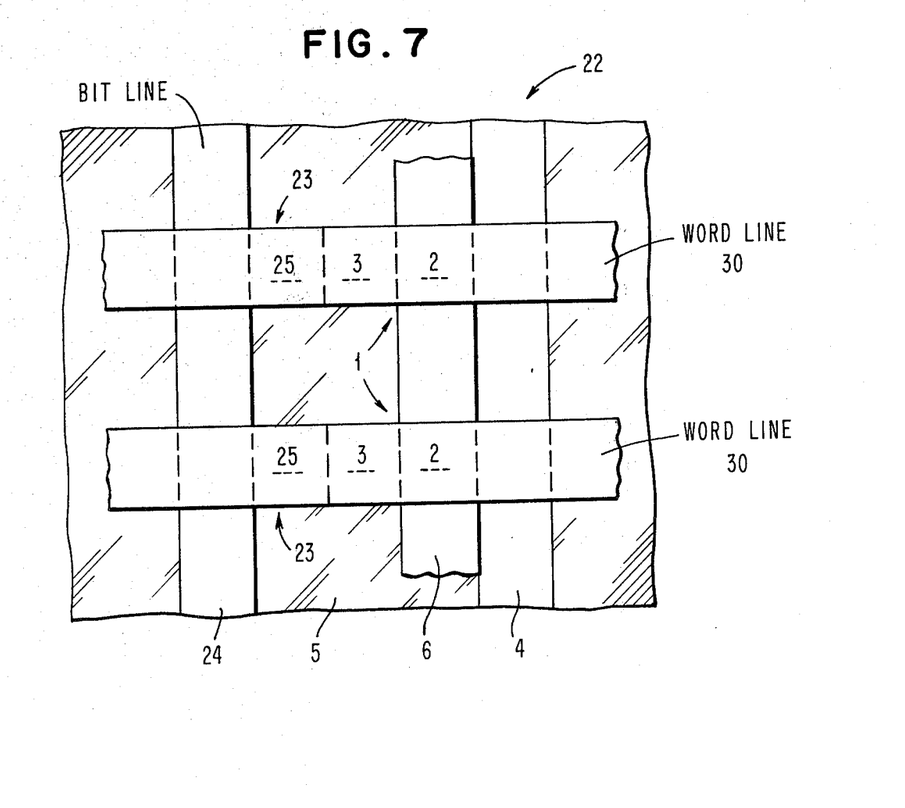
FIG. 7 shows the layout of the memory cell of FIG. 6 is a bitorganized memory array configuration wherein the extremities of the storage device channel region are isolated from the substrate by recessed oxide.

Referring now to FIG. 7, there is shown a layout of the memory cell of FIG. 6 in a bit organized memory array wherein the extremities of the storage device channel region are isolated from the substrate by a recessed oxide. As should be obvious from what is shown in FIG. 7, the layout does not incorporate the annular device of FIG. 1A but rather includes what may be characterized as an open-channel structure, the channel surfaces of which are isolated from the substrate by a recessed oxide. The recessed oxide technique permits the use of open-channel devices by effectively terminating the channel regions of both the storage device 1 and the addressing FET 23 with a dielectric formed by silicon regrowth to form silicon dioxide in a manner well known to those skilled in the semiconductor art.

Referring now in more detail to FIG. 7, the elements of FIG. 7 will be related to the elements of FIG. 6 by utilizing the same reference characters. Thus, bit line 28 which is shown connected to diffusion 24 via interconnection 27 in FIG. 6 is shown in FIG. 7 by diffusion 24 and is otherwise identified therein as bit line. In FIG. 6 word line 30 is shown connected to gate electrode 25 via interconnection 29. Word line 30 is identified by both terminologies in FIG. 7 and that portion of word line 30 which constitutes gate electrode 25 for device 23 is identified as such in FIG. 7. Common diffusion 3 is shown disposed in substrate 5 adjacent gate electrode 25. Gate electrode 6 which in the embodiment of FIG. 7 is preferably a silicon gate is disposed over ion-implanted regions 2 and is adjacent a diffusion 4 disposed in substrate 5 which forms the grounded drain diffusion of storage device 1. The shaded regions shown in FIG. 7 are intended to represent those areas of substrate 5 which have been regrown to form a recessed oxide (ROX). From this, it should be clear that channel region 2 and the channel under gate electrode 25 are terminated at the ends thereof by recessed oxide thereby isolating the channel regions from substrate 5 so that leakage paths which would destroy the deep depletion operation of an unisolated device are eliminated. While not specifically shown in FIG. 7, it should be appreciated that devices 1 and 23 can be repeated horizontally as well as vertically to form an array of memory cells in the usual manner.

The activation of a typical device 1 utilizes approximately five volt positive and negative excursions for a period of approximately two microseconds. Read signals having an amplitude of approximately two volts have been found to be sufficient. These parameters are however not critical and wide variations may be achieved depending upon the design parameters and the semiconductor materials utilized.

While only N channel devices have been utilized in connection with the above-described figures, it should be appreciated that P channel counterparts of the device and memory cell described hereinabove can be fabricated with opposite type semiconductor materials and that such devices and memory cells may be actuated with polarities opposite to those shown in FIGS. 4B and 5B.

Finally, it should be appreciated that because of its long retention time in the nonconductive or quasistable state and the nature of the decay to the equilibrium or stable state, the devices described hereinabove can also be used as photon counters and light integrators. Incident light which impinges on a gate electrode which may be transparent and penetrates to the semiconductor surface depletion layer will produce electron-hole pairs for each impinging photon. The holes will be accumulated at the silicon surface and electrons settled in the channel and made available for conduction. The formation of photo-generated characters is cumulative. Thus, by sensing the conductivity of the channel, one can measure quantitatively the presence of the photon dosage. It should be appreciated that for each electron-hole pair generation and separation the polarization potential accelerates the decay of the deep depletion of the channel regions. The maximum number of photons which can be counted is equal to the number of electrons depleted by the gate in the deep depletion state.

What has been provided in the present application is a single memory device with nondestructive read-out. In addition, a device with a relatively long retention time requiring infrequent refreshing has also been provided. Also, because the read signal strength is determined by the width-to-length ratio rather than the area of the storage device, its size is only limited by the capabilities of the photolithography technique utilized. Also, very little stand-by power is required.

While the invention has been particularly shown and described with reference to preferred embodiments thereof, it will be understood by those skilled in the art that various changes in form and details may be made therein without departing from the spirit and scope of the invention.

What is claimed is:

1. An array of semiconductor storage devices each semiconductor storage device comprising,
   a semiconductor substrate of one conductivity type,
   a source and drain region of opposite conductivity type disposed in said substrate and a channel region of said opposite conductivity type disposed between and interconnecting said source and drain regions the surface of said channel region being in electrically isolated relationship with the surface of said substrate outside of said channel region,
   a gate electrode disposed in insulated spaced relationship with said channel region,
   means connected to said device for applying a first voltage of one polarity for forming an inversion layer at the surface of said channel region rendering said device conductive and for applying a second voltage of opposite polarity for forming a depletion region between said source and drain regions rendering said device non-conductive, and,
   means connected to said gate electrode and said substrate for applying a fixed value of bias voltage to maintain said inversion layer or said depletion region after said first or second voltage is applied.

2. A semiconductive storage device according to claim 1 further including means connected to said device for reading the state of said device.

3. A semiconductive storage device according to claim 1 wherein said means for applying first and second voltages to said device includes means connected to said gate electrode for applying a pulse of one polarity to render said device conductive and a pulse of the opposite polarity to render said device non-conductive.

4. A semiconductive storage device according to claim 1 wherein said means for applying first and second voltages to said device includes means connected to said source region for applying a pulse of one polarity to render said device conductive and a pulse of the opposite polarity to render said device non-conductive.

5. A semiconductive storage device according to claim 1 wherein one of said source and drain regions surrounds the other of said regions forming an annular channel region and wherein said gate electrode is annular, said regions and said gate electrode forming an annular field effect transistor.

6. A semiconductor device according to claim 1 further including means disposed at the extremites of said channel region for isolating the surface thereof from said substrate.

7. A semiconductor device according to claim 6 wherein said means for isolating includes a recessed oxide region disposed at the extremities of said channel region.

8. An array of memory cells each memory cell comprising,
   a semiconductor substrate of one conductivity type,
   first, second and third regions of opposite conductivity type disposed in said substrate said first and second regions having a channel region of said opposite conductivity type disposed between and interconnecting said first and second regions and forming a storage device the surface of said channel region of opposite conductivity type being in electrically isolated relationship with the surface of said substrate outside of said channel regions said second and third regions having a channel region of said one conductivity type disposed between said second and third regions and forming an addressing device,
   a gate electrode disposed in insulated space relationship with each of said channel regions,
   means connected to said addressing device for applying a first voltage of one polarity for forming an inversion layer at the surface of said channel region of said storage device rendering said storage device conductive and for applying a second voltage of opposite polarity for forming a depletion region between said first and second regions rendering said storage device non-conductive, means connected to said gate electrode and said substrate of said storage device for applying a fixed value of bias voltage to maintain said inversion layer or said depletion region after said first or second voltage is applied, and, means connected to said addressing device for selecting said storage device.

9. A memory cell according to claim 8 further including means connected to said storage device and said addressing device for reading said memory cell.

10. A memory cell according to claim 8 wherein said means for applying includes means connected to said first region for applying a pulse of one polarity to render said storage device conductive and a pulse of the opposite polarity to render said storage device non-conductive.

11. A memory cell according to claim 8 wherein means for selecting includes a word line connected to said gate electrode of said addressing device and a pulsed source connected to said word line for rendering said addressing device conductive.

12. A memory cell according to claim 8 further including means disposed at the extremities of said channel regions for isolating the surface of said channel region of said storage device from said substrate.

13. A memory cell according to claim 12 wherein said means for isolating includes a recessed oxide region disposed at the extremities of said channel region of said storage device.

* * * * *